United States Patent
Ahn et al.

(10) Patent No.: US 7,539,910 B2
(45) Date of Patent: May 26, 2009

(54) MEMORY MODULE TEST SYSTEM FOR MEMORY MODULE INCLUDING HUB

(75) Inventors: Young-Man Ahn, Yongin-si (KR); Byung-Se So, Seongnam-si (KR); Seung-Jin Seo, Suwon-si (KR); Seung-Man Shin, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1097 days.

(21) Appl. No.: 10/900,140

(22) Filed: Jul. 28, 2004

(65) Prior Publication Data

US 2005/0023560 A1   Feb. 3, 2005

(30) Foreign Application Priority Data

Jul. 28, 2003   (KR)  ...................... 10-2003-0052111

(51) Int. Cl.
*G11C 29/00* (2006.01)
(52) U.S. Cl. ...................................... 714/718; 714/733
(58) Field of Classification Search ................. 702/117; 365/201; 710/22; 370/468; 714/718, 701, 714/733
See application file for complete search history.

(56) References Cited

U.S. PATENT DOCUMENTS

| | | | | |
|---|---|---|---|---|
| 6,324,485 | B1 * | 11/2001 | Ellis | 702/117 |
| 6,754,117 | B2 * | 6/2004 | Jeddeloh | 365/201 |
| 7,222,197 | B2 * | 5/2007 | Jeddeloh | 710/22 |
| 7,269,184 | B2 * | 9/2007 | Kobayashi | 370/468 |
| 7,389,364 | B2 * | 6/2008 | Jeddeloh | 710/22 |
| 2002/0199139 | A1 | 12/2002 | Dortu et al. | |

FOREIGN PATENT DOCUMENTS

| | | |
|---|---|---|
| JP | 08-129900 | 5/1996 |
| JP | 09-213093 | 8/1997 |
| KR | 2000-0007258 | 4/2000 |
| KR | 1020010004387 | 1/2001 |

\* cited by examiner

*Primary Examiner*—David Ton
(74) *Attorney, Agent, or Firm*—Volentine & Whitt, PLLC

(57) ABSTRACT

A memory module test system including at least one memory module. The at least one memory module includes a first hub and a plurality of semiconductor memory devices. The system includes a tester for testing the at least one memory module. A second hub is located between the first hub and the tester. The second hub is for converting a memory command and memory data output from the tester into packet data and transmits the packet data to the first hub. The second hub converts the packet data output from the first hub into memory data and transmits the memory data to the tester.

11 Claims, 8 Drawing Sheets

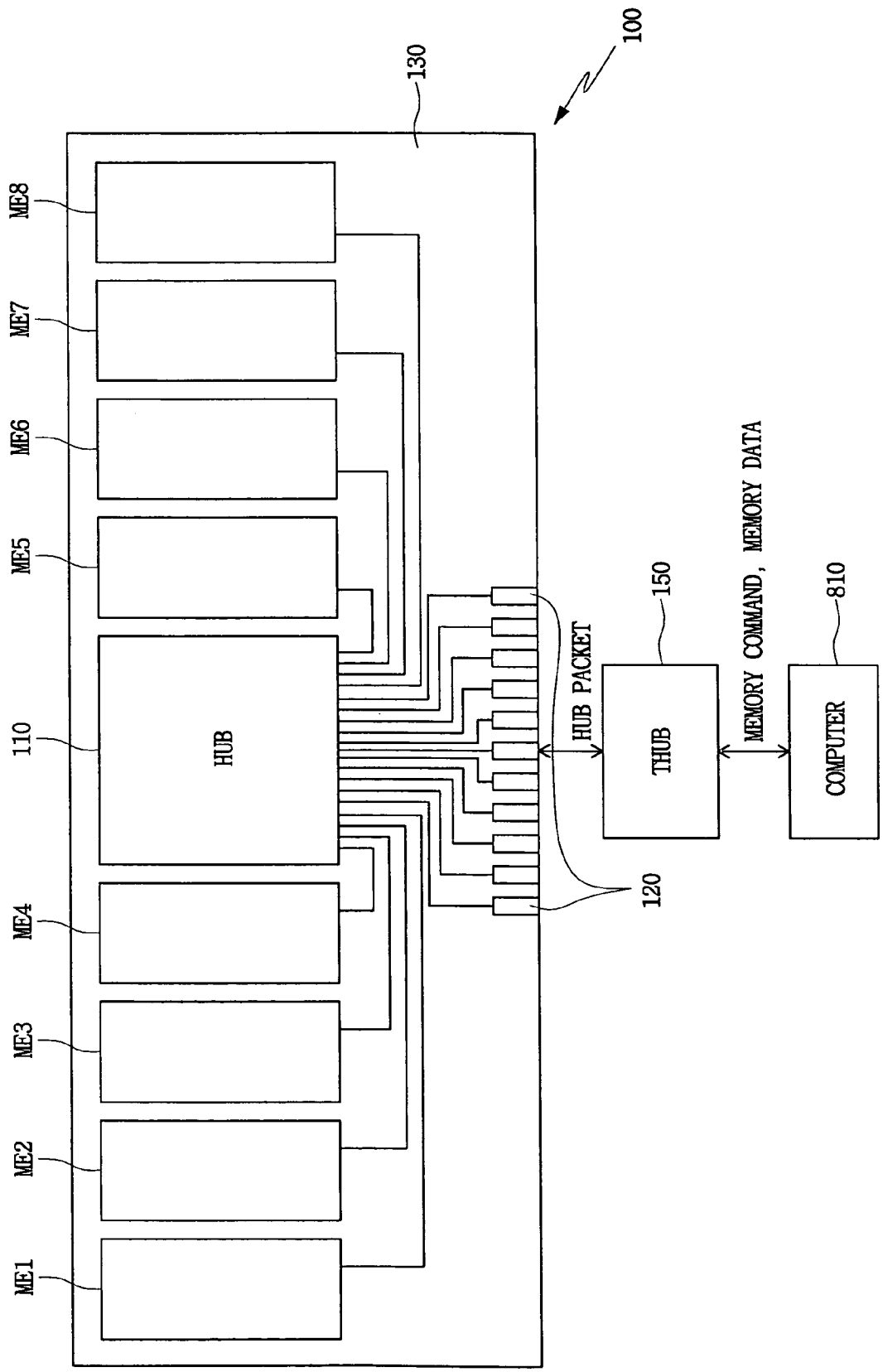

MEMORY MODULE TEST SYSTEM FOR MEMORY MODULE INCLUDING HUB

BACKGROUND OF THE INVENTION

1. Field of the Invention

Embodiments of the present invention relate to a memory module test system and a memory module evaluation system. The memory module test system which can test a memory module having a hub.

2. Background of the Related Art

Operation speed of a memory module needs to be the same as a system incorporating the memory module. However, the operation speeds of related art memory modules may not be compatible with the operation speed of many systems. Accordingly, as the memory operation speeds of systems increase during development of systems, the operation speeds of compatible memory modules must also increase. Accordingly, a memory module including a hub for a high speed system is being developed. However, a memory module including a hub can not be tested by an existing general tester, since the tester can not input output data which is suitable to the speed and data format of the memory module.

This application claims the benefit of Korean Patent Application No. 2003-52111, filed Jul. 28, 2003, the disclosure of which is hereby incorporated herein by reference in its entirety.

SUMMARY OF THE INVENTION

An object of embodiments of the present invention is a memory module test system that can test a memory module having a hub. An object of embodiments of the present invention is a memory module evaluation system which can evaluate a memory module having a hub in a memory module mounting system which uses a memory module having no hub.

Embodiments of the present invention provide a memory module test system, including the following. At least one memory module including a first hub and a plurality of semiconductor memory devices. A tester testing the at least one memory module. A second hub located between the first hub mounted on any one of the at least memory module and the tester. The second hub converts a memory command and memory data outputted from the tester into packet data. The second hub transfers the packet data to the first hub. The second hub converts the packet data output from the first hub into memory data and transfers the memory data to the tester. The second hub may be mounted on the tester.

The second hub may include an encoder for receiving the memory command and the memory data from the tester. The encoder may convert the memory command and the memory data into first data in data packet form and transfer the first data in data packet form to the first hub. The second hub may include a decoder for receiving second data in data packet form from a memory module adjacent to the memory module. The decoder may convert the second data in data packet form into parallel data having a predetermined bit structure.

The second hub may include a first selecting means for receiving first data in data packet form and second data in data packet form. The first selecting means selects one of the first and second data. The second hub may include a data dividing means for receiving the output of the first selecting means and dividing the output of the first selecting means into a command packet and a data packet. The second hub may include a first decoder for receiving a first output of the data dividing means and converting the first output into a memory command and transferring the memory command to a memory command terminal. The second hub may include a first encoder for receiving a memory command from the memory command terminal and memory data from the memory data terminal, outputting second data in data packet form. The second hub may include a second encoder for receiving memory data from a memory data terminal and converting the memory data into data in packet form. The second hub may include a second decoder for receiving a second output of the data dividing means and for converting the second output into memory data, transferring the memory data to the memory data terminal. The second hub may include a first connection line for transferring the first data in data packet form to an adjacent memory module. The second hub may include a second connection line for receiving and outputting third data in packet form from the adjacent memory module. The second hub may include a second selecting means for receiving the third data and an output signal of the data dividing means. The second selecting means is also for selecting one of the third data and the output signal of the data dividing means.

Embodiments of the present invention include a memory module evaluation system, comprising the following. A memory module including a first hub and a plurality of semiconductor memory devices. A memory module mounting system. A second hub located between the first hub and the memory module mounting system. The second hub is for converting a memory command and memory data output from the memory module mounting system into data in data packet form. The second hub is also for transferring the data in data packet form to the first hub and for converting the data in data packet form, output from the first hub, into memory data and transferring the memory data to the memory module mounting system.

BRIEF DESCRIPTION OF THE DRAWINGS

FIG. 8 is an exemplary plan view illustrating a configuration of a memory module having a hub that is mounted by using a test hub in a circumstance that a memory module having no hub is used.

DETAILED DESCRIPTION OF THE INVENTION

Figure 1:
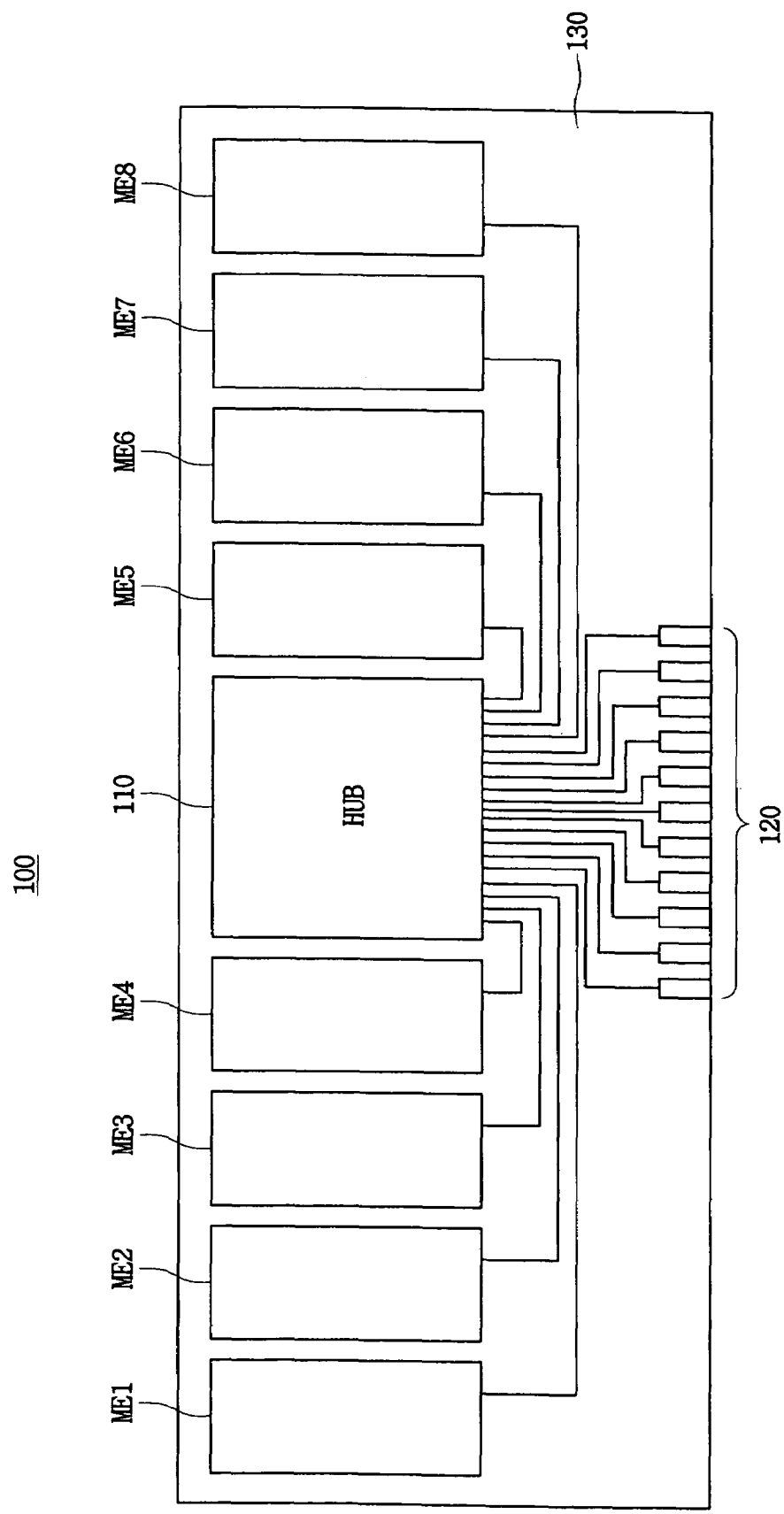
FIG. 1 is an exemplary plan view illustrating a memory module having a hub.

The present invention is described with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity.

FIG. 1 is an exemplary plan view illustrating a memory module having a hub, according to embodiments of the present invention. In FIG. 1, the memory module 100 includes the substrate 130, the hub 110, the plurality of semiconductor memory devices ME1 to ME8, and the plurality of input/output (I/O) taps 120. The hub 110 receives data in packet form from the I/O tap 120. The I/O tap 120 is mounted on the substrate 130. The hub 110 converts the received data into memory commands and data which can be received and transmitted by the semiconductor memory devices ME1 to ME8, through corresponding wires.

A memory system may include a plurality of memory modules, as illustrated in FIG. 1. A channel between a chip set and respective modules are established in a point-to-point method. If a plurality of modules are mounted, when a signal transferred to the control signal tap 120 of the module is a signal of a corresponding memory module 100, the hub 110 transfers the signal to the semiconductor memory devices ME1 to ME8. If a plurality of modules are not mounted, the signal is connected by a point-to-point method and the signal is transferred to a hub of the next module.

The semiconductor memory devices of the memory module 100 may operate by receiving signals such as CS, RAS, CAS, WE, Address, and DQ in parallel. However, signals input into the control signal tap 120 of the memory module are data in data packet form. Data in data packet form is data mixed with a command. Accordingly, the hub 110 decodes data in data packet form by converting the data into memory commands in parallel form (e.g. as CS, RAS, CAS, WE, Address, and DQ) to operate the semiconductor memory device.

Figure 2:
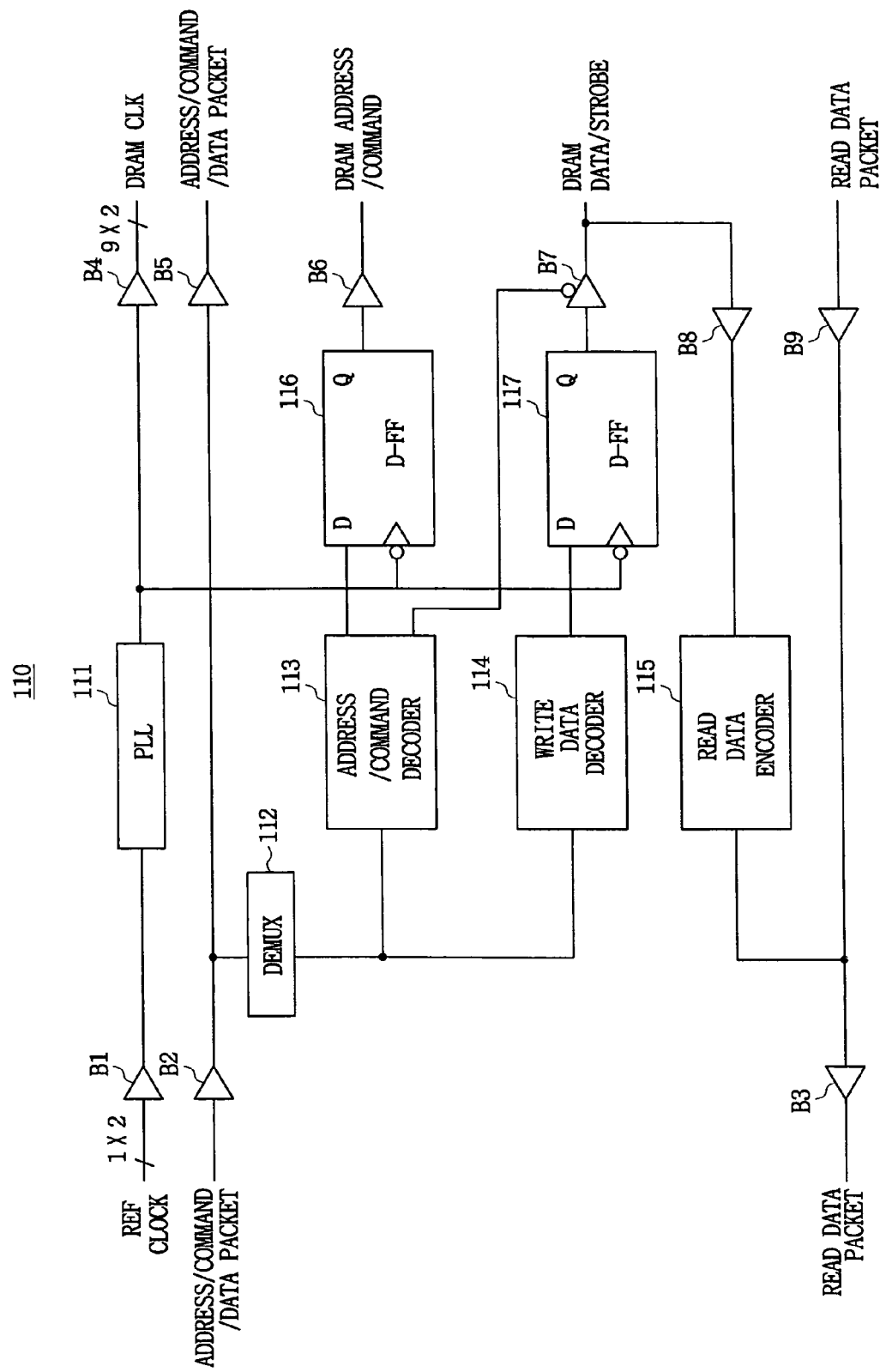
FIG. 2 is an exemplary block diagram illustrating the hub of FIG. 1.

FIG. 2 is an exemplary block diagram illustrating the hub of FIG. 1. In FIG. 2, the hub 110 includes the phase locked loop (PLL) 111, the DEMUX 112, the address/command decoder 113, the write data decoder 114, the read data encoder 115, the first D-flip-flop 116, and the second D-flip-flop 117. Buffers B1 to B9 are connected at respective input terminals and output terminals.

In FIG. 2, phase synchronization of a reference clock is carried out by the PLL 111. The phase-synchronized clock signal is used as a DRAM clock signal and a clock signal controlling flip-flops 116 and 117. In FIG. 2, terminals on the left side may be connected to a tap of the memory module. Terminals on the right side may be connected to the semiconductor memory devices.

Data packet ADDRESS/COMMAND/DATA PACKET, in which a command and data of DRAM are mixed, is either transferred to the next memory module or divided into a command packet and a data packet by the DEMUX 112. The address/command decoder 113 decodes the received command packet to be converted into a memory command. The write data decoder 114 converts the data packet into bits of parallel data. The read data encoder 115 converts DRAM read data in parallel form into data in packet form. The hub 110 receives packet data READ DATA PACKET output from a memory module adjacent to a memory module having the hub 110. The hub 110 outputs packet data READ DATA PACKET to an adjacent memory module. The first and second D-flip-flops 116 and 117 synchronize the output of the address/command decoder 113 and the output of the write data decoder 114 with DRAM clock DRAM CLK, respectively.

Figure 3:
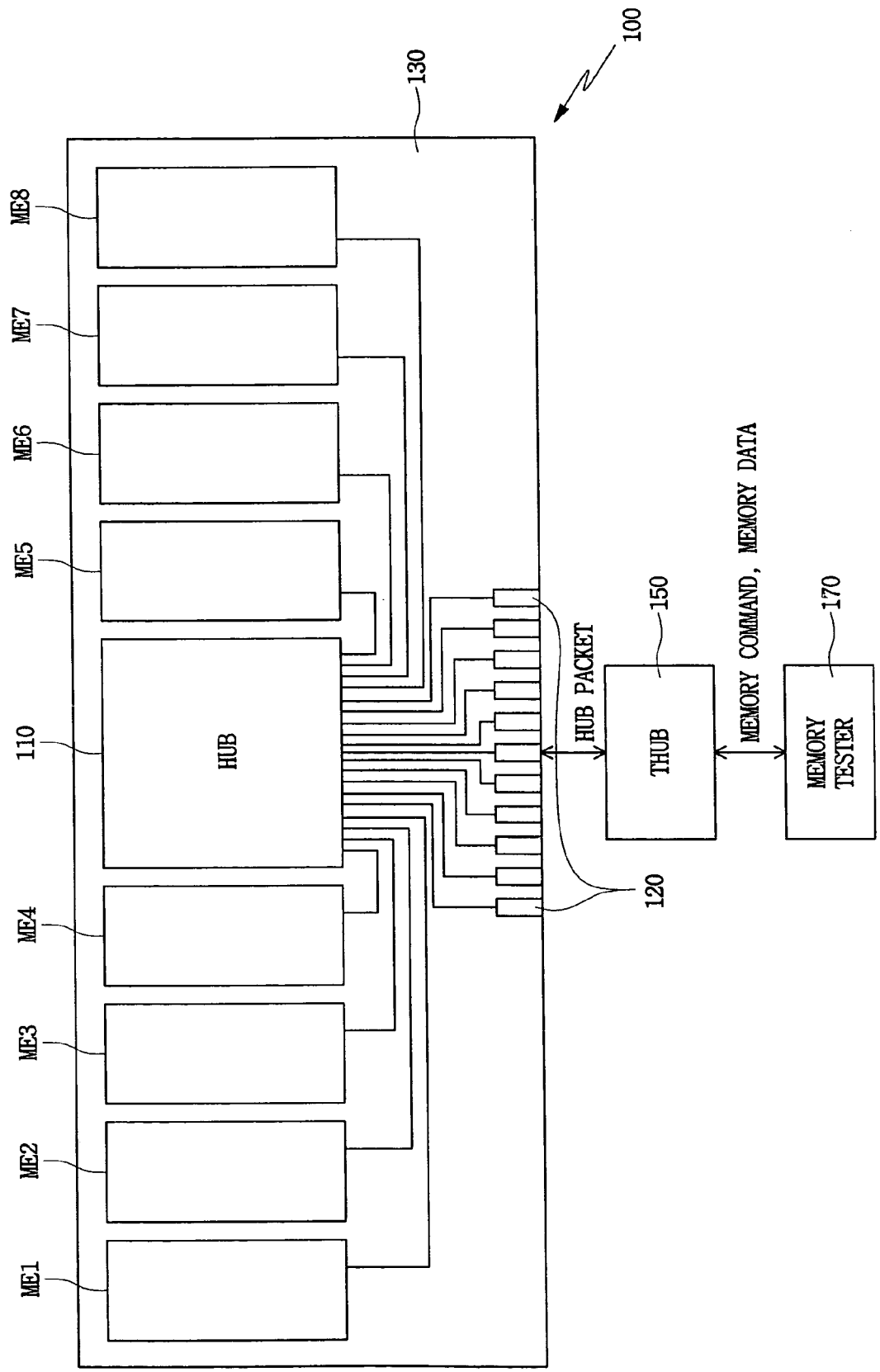
FIG. 3 is an exemplary plan view illustrating a memory module test system.

FIG. 3 is an exemplary plan view illustrating a memory module test system according to embodiments of the present invention. In FIG. 3, the memory module test system includes the memory module 100, the test hub 150, and the tester 170. The memory module 100 includes the hub 110, the plurality of input/output (I/O) taps 120, the substrate 130, and the plurality of semiconductor memory devices ME1 to ME8.

In FIG. 3, memory command MEMORY COMMAND generated from the tester 170 is converted into data packet HUB PACKET by the test hub 150. The hub 110, in the memory module 100, converts the data packet HUB PACKET into a memory command, which is a signal capable of interfacing with the memory and transfers the memory command to the semiconductor memory devices ME1 to ME8.

Figure 4:
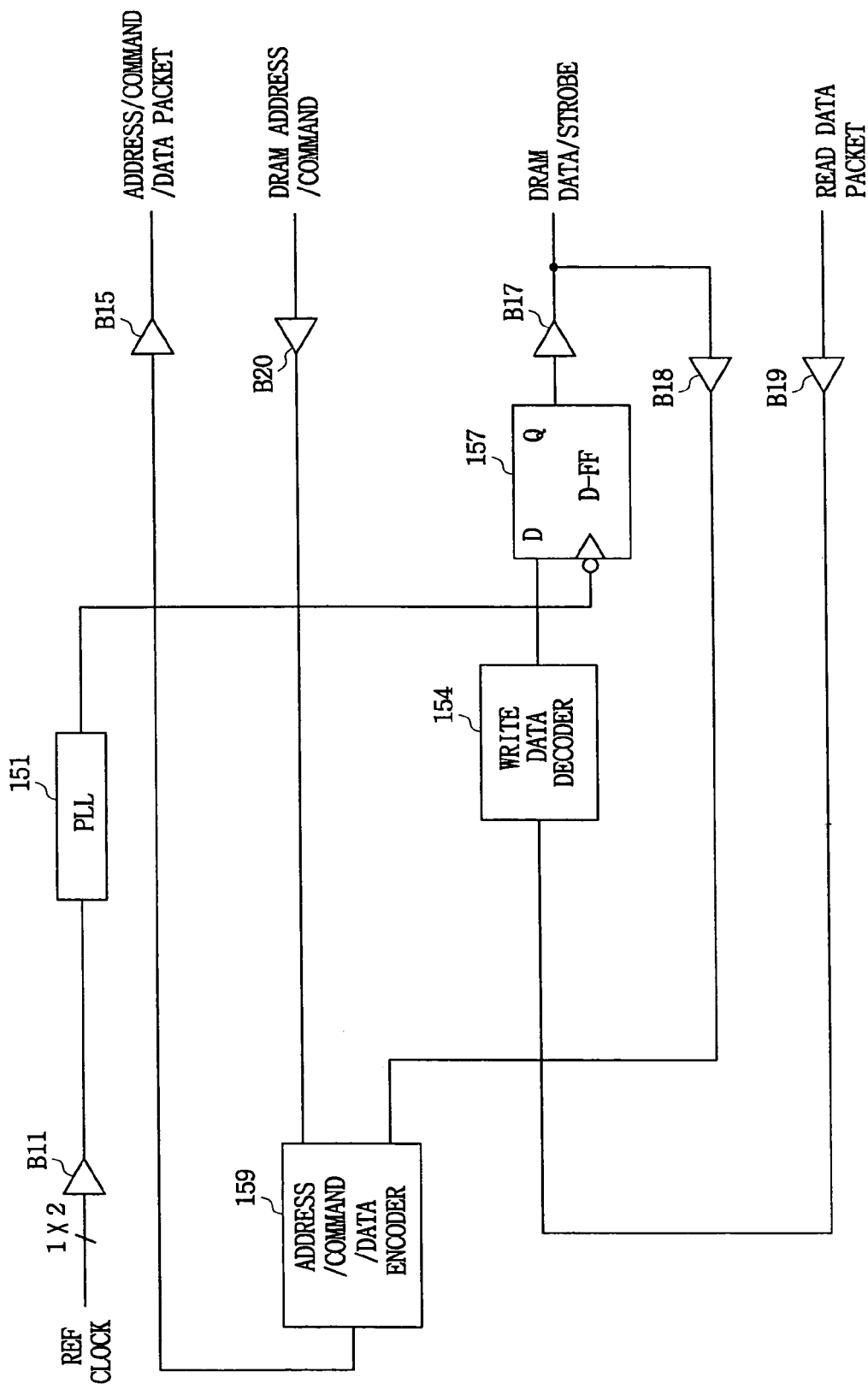
FIG. 4 is an exemplary block diagram illustrating a test hub of FIG. 3.

FIG. 4 is an exemplary block diagram illustrating the test hub 150 of FIG. 3. In FIG. 4, the test hub 150 includes the phase locked loop (PLL) 151, the write data decoder 154, the D-flip-flop 157, and the address/command/data encoder 159. Buffers B11, B15, and B17 to B20 are connected at respective input terminals and output terminals. In FIG. 4, a terminal to which a reference clock signal REF CLOCK is input, a terminal to which a signal DRAM ADDRESS/COMMAND is input, and a terminal to which a signal DRAM DATA/STROBE is input or output are connected to the tester 170 of FIG. 3. A terminal to which a signal ADDRESS/COMMAND/DATA PACKET is output is connected to the hub 110 of FIG. 3.

In FIG. 4, phase synchronization of a reference clock REF CLOCK is carried out by the PLL 151. The phase-synchronized clock signal is also used as a clock signal of flip-flop 157. The write data decoder 154 converts a data packet into parallel data having predetermined bits. The D-flip-flop 157 synchronizes an output of the write data decoder 154 with a DRAM clock DRAM CLK. The address/command/data encoder 159 receives a memory command DRAM ADDRESS/COMMAND and a memory data DRAM DATA/STROBE from the tester 170 of FIG. 3. The address/command/data encoder 159 converts the memory command DRAM ADDRESS/COMMAND and the memory data DRAM DATA/STROBE into a data packet. The address/command/data encoder 159 transfers the memory command DRAM ADDRESS/COMMAND and the memory data DRAM DATA/STROBE to the hub 110 of the memory module 100 of FIG. 3. If a memory system comprised of a plurality of memory modules, data in packet form received from an adjacent memory module of the corresponding memory module is converted into a memory data by the write data decoder 154. The memory module which transfers packet signals can be tested by using the test hub of FIG. 4, which has a different operation than the hub of the memory module.

Figure 5:
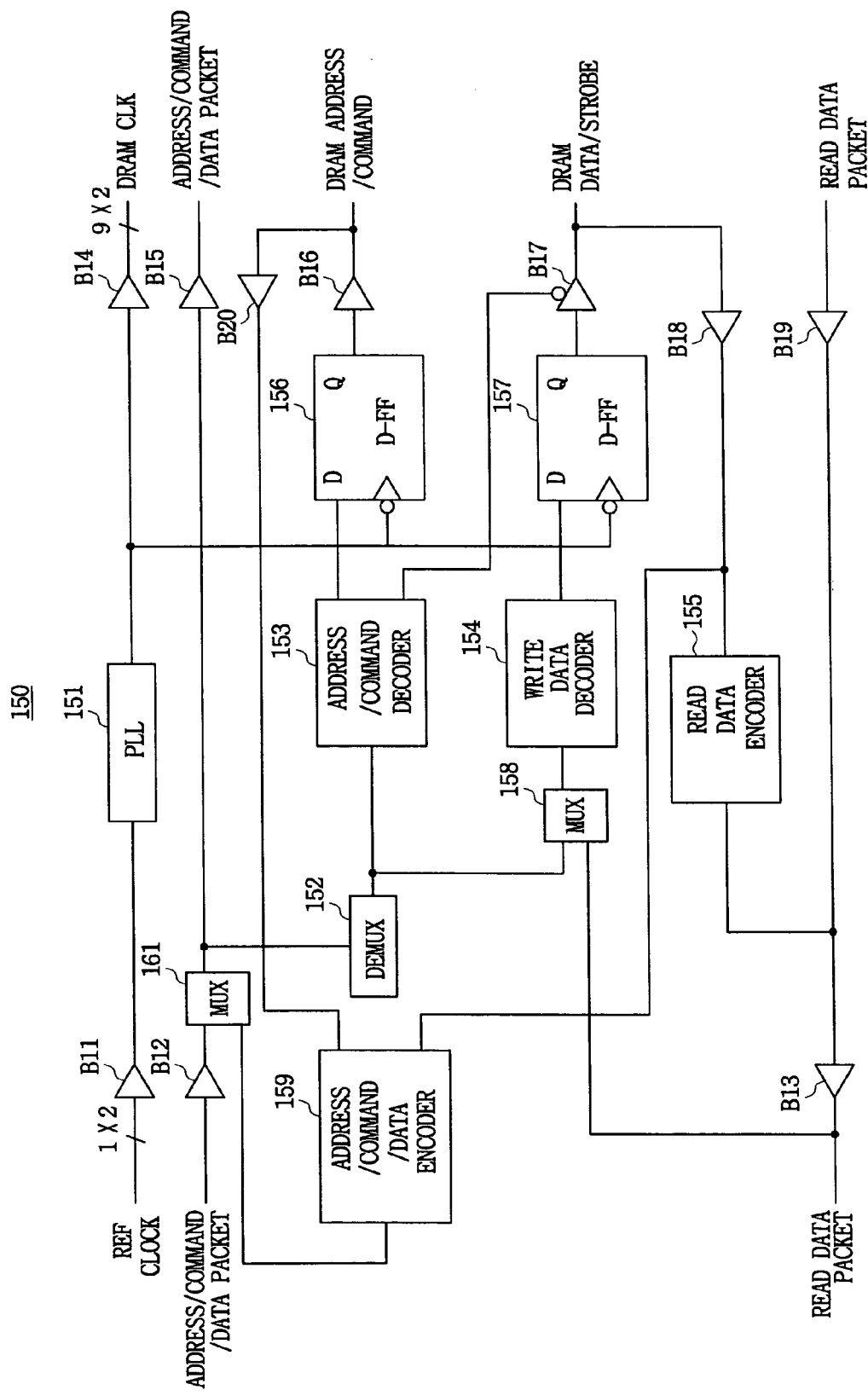
FIG. 5 is an exemplary block diagram illustrating a test hub of FIG. 3.

FIG. 5 is an exemplary block diagram illustrating the test hub 150 of FIG. 3 according to embodiments of the present invention. The test hub of FIG. 5 is configured to have all functions of the test hub of FIG. 4, plus the functions of the hub of FIG. 2. In FIG. 5, the test hub 150 includes the phase locked loop (PLL) 151, the DEMUX 152, the address/command decoder 153, the write data decoder 154, the read data encoder 155, the first D-flip-flop 156, the second D-flip-flop 157, the first MUX 158, the second MUX 161, and the address/command/data encoder 159. Buffers B11 to B20 are connected at respective input terminals and output terminals.

In embodiments, a circuit having both a test hub function and a hub function can be implemented on a semiconductor chip. Accordingly, the same chip can be used as both a hub mounted on a memory module and a test hub mounted on a tester. This versatility may simplify manufacturing and reduce manufacturing costs for both testers and memory modules.

In FIG. 5, phase synchronization of a reference clock signal REF CLOCK is carried out by the PLL 151. The phase-synchronized clock signal is used as a DRAM clock signal DRAM CLOCK and a clock signal of flip-flops 156 and 157.

Packet data ADDRESS/COMMAND/DATA PACKET, having a DRAM command and data together, may be transferred to an adjacent memory module or divided into a command packet and a data packet by the DEMUX 152. The address/command decoder 153 decodes a received command packet to be converted into a memory command. The write data decoder 154 converts a data packet into parallel data having bits. The read data encoder 155 converts DRAM read data in parallel form into packet data.

The address/command/data encoder 159 may receive memory command DRAM/ADDRESS/COMMAND and memory data DRAM DATA/STORBE from the tester 170 of FIG. 3. The address/command/data encoder 159 may convert memory command DRAM/ADDRESS/COMMAND and memory data DRAM DATA/STORBE into packet data and transfers the packet data to the hub 110 of FIG. 3 of the memory module. The first D-flip-flop 156 and the second D-flip-flop 157 operate to synchronize the output of the address/command decoder 153 and the output of the write data decoder 154 with the DRAM clock DRAM CLK.

Figure 6:
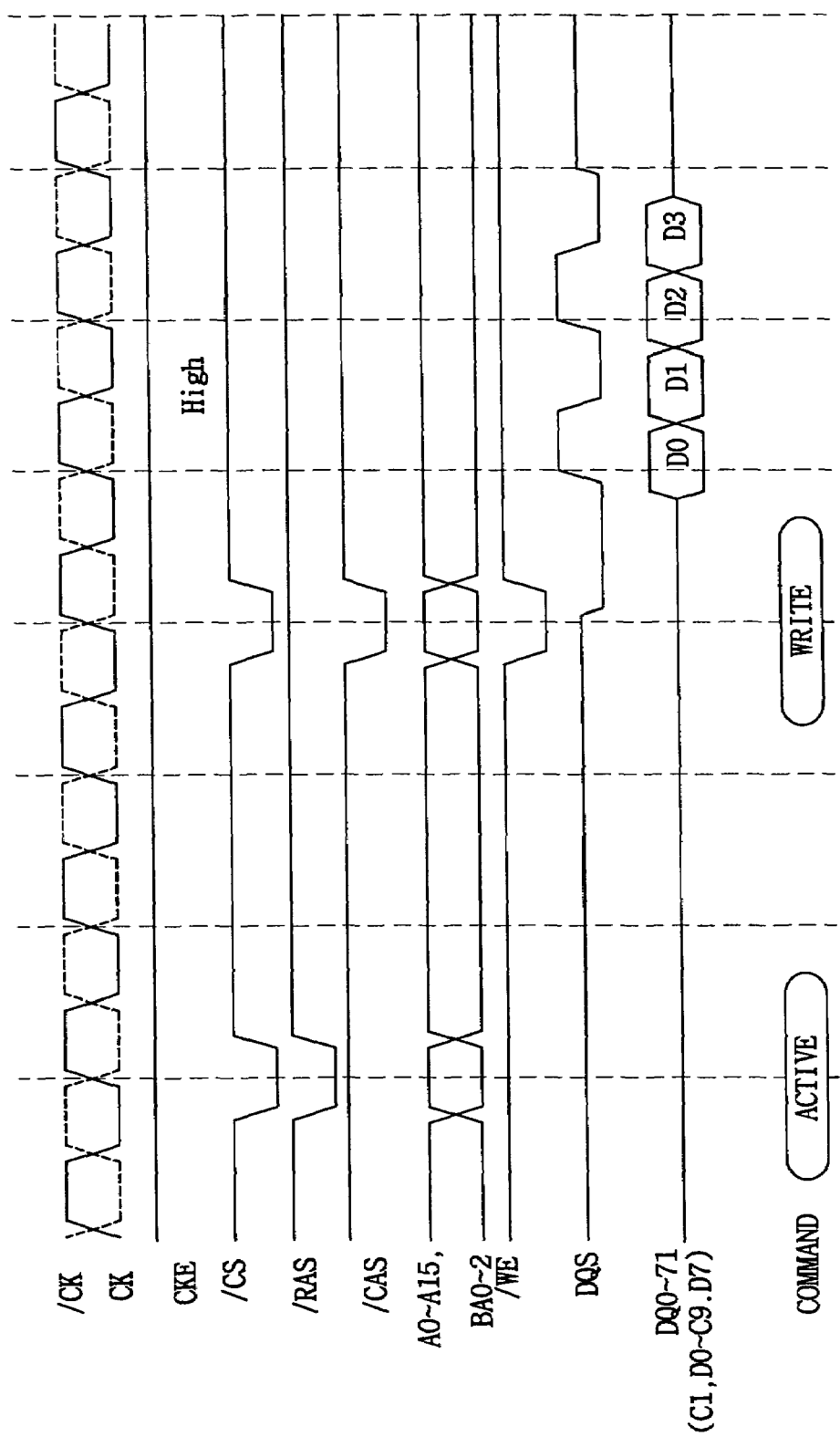
FIG. 6 is an exemplary timing diagram illustrating a tester that applies a memory command to the test hub in the memory module test system of FIG. 3.

FIG. 6 is an exemplary timing diagram illustrating a tester applying a memory command to the test hub in the memory module test system of FIG. 3, in which a memory module is configured in a single rank.

Among the signals shown in FIG. 6, both memory commands CLE, /CS, /RAS, /CAS and /WE and address signals A0-A15 and BA0-BA2 are inputted into the memory command DRAM ADDRESS/COMMAND terminal of the test hub 150 shown in FIG. 4 or 5 in parallel, while both a data strobe signal DQS and data signals DQ0-DQ72 or C1.D0-C9.D7 are inputted into the memory data DRAM DATA/STROBE terminal of the test hub 150. In other words, at respective sections D0, D1, D2 and D3 of FIG. 6, 72 data signals C1.D0-C9.D7 are inputted in parallel.

Table 1 illustrates an exemplary configuration of 10-bit packet frames, according to respective clock signals, when the test hub converts the memory command as shown in FIG. 6 into the packet data, wherein the configuration is applicable to any case where the memory module is configured in a single rank or double ranks. At this time, in order to output the 10-bit packet frames, the clock signals having a frequency higher than that of the memory clock signal CK shown in FIG. 6 are used. The test hub outputs $n^{th}$ to $(n+11)^{th}$ data shown in Table 1 in parallel at respective rising and falling parts of the clock signals.

In the memory module test system of FIG. 3, the tester 170 applies the commands CKE, /CS, /RAS, /CAS and /WE and the address signals A0-A15, and the data signals C1.D0-C9.D7 as shown in FIG. 6 to the DRAM ADDRESS/COMMAND terminal and the DRAM DATA/STROBE terminal of the test hub of FIG. 5, respectively. These signals are transferred to the address/command/data encoder 159 of FIG. 5 and converted into the packet data exemplified in Table 1.

TABLE 1

| Bit | 9 | 8 | 7 | 6 | 5 | 4 | 3 | 2 | 1 | 0 |
|---|---|---|---|---|---|---|---|---|---|---|
| n | X | E2 | X | CS0 | WE | BA0 | A12 | A8 | A4 | A0 |
| n + 1 | X | E3 | X | CS1 | CAS | BA1 | A13 | A9 | A5 | A1 |
| n + 2 | X | E4 | E0 | 1 | RAS | BA2 | A14 | A10 | A6 | A2 |
| n + 3 | X | E5 | E1 | X | CKE | RS | A15 | A11 | A7 | A3 |
| n + 4 | X | C9.D0 | C8.D0 | C7.D0 | C6.D0 | C5.D0 | C4.D0 | C3.D0 | C2.D0 | C1.D0 |
| n + 5 | X | C9.D1 | C8.D1 | C7.D1 | C6.D1 | C5.D1 | C4.D1 | C3.D1 | C2.D1 | C1.D1 |
| n + 6 | X | C9.D2 | C8.D2 | C7.D2 | C6.D2 | C5.D2 | C4.D2 | C3.D2 | C2.D2 | C1.D2 |
| n + 7 | X | C9.D3 | C8.D3 | C7.D3 | C6.D3 | C5.D3 | C4.D3 | C3.D3 | C2.D3 | C1.D3 |
| n + 8 | X | C9.D4 | C8.D4 | C7.D4 | C6.D4 | C5.D4 | C4.D4 | C3.D4 | C2.D4 | C1.D4 |
| n + 9 | X | C9.D5 | C8.D5 | C7.D5 | C6.D5 | C5.D5 | C4.D5 | C3.D5 | C2.D5 | C1.D5 |
| n + 10 | X | C9.D6 | C8.D6 | C7.D6 | C6.D6 | C5.D6 | C4.D6 | C3.D6 | C2.D6 | C1.D6 |
| n + 11 | X | C9.D7 | C8.D7 | C7.D7 | C6.D7 | C5.D7 | C4.D7 | C3.D7 | C2.D7 | C1.D7 |

In other words, the test hub 150 shown in FIG. 5 receives the commands CKE, /CS, /RAS, /CAS and /WE and the address signals A0-A15, and the data signals C1.D0-C9.D7 to output the data ADDRESS/COMMAND/DATA PACKET in 10-bit packet form as represented in Table 1 when the chip select signal /CS is activated.

In Table 1, A0-A15 and BA0-BA2 stand for the address signals, RS stands for the rank select signal selecting the rank when the memory module is configured in the double ranks, WE, CAS, RAS and CKE stand for /WE, /CAS, /RAS and CKE signals of FIG. 6 respectively, CS0 and CS1 stand for the chip select signal /CS of FIG. 6, C1.D0-C9.D7 stand for the data signals C1.D0-C9.D7 of FIG. 6, respectively.

Specifically, in Table 1, in consideration that the memory module is configured in the double ranks, two bits CS0 and CS1 are allocated to the chip select signal, and the chip select signal has the rank select signal RS for selecting the rank.

Further, among the data in packet form represented in Table 1, the ninth bit bit9 is reserved as the bit for checking an error of the data in packet form. Among the other bits bit0-bit8 except the ninth bit bit9, ones represented by a symbol "X" refer to unused, don't care, bits. E0-E5 are the bits for checking errors of the commands and addresses outputted from the $n^{th}$ data in bit form to the $(n+3)^{th}$ data. The $(n+2)^{th}$ data of the sixth bit bit6 is the bit used when characteristics of the hub are calibrated, and is set to default 1 on testing.

It is shown in Table 1 that the data signals C1.D0-C9.D7 are outputted once. However, as shown in FIG. 6, when the data signals C1.D0-C9.D7 are outputted four times D0, D1, D2 and D3, the data outputted from the $(n+4)^{th}$ data in bit form in Table 1 to the $(n+11)^{th}$ data are outputted four times in succession.

The signal converted into packet data is transferred to the hub 110 of the memory module 100 of FIG. 3. The hub 110 converts the packet data into parallel signals and generates the parallel signals of FIG. 6 to write the parallel data to the semiconductor memory device. A read command may also be transferred using the same path as the write command. A read data of the semiconductor memory device is converted into packet data READ DATA PACKET by the hub of the memory module 100. Packet data READ DATA PACKET is then transferred to an adjacent memory module. Packet data READ DATA PACKET is also converted into parallel data having predetermined bits by the write data decoder 154.

Figure 7:
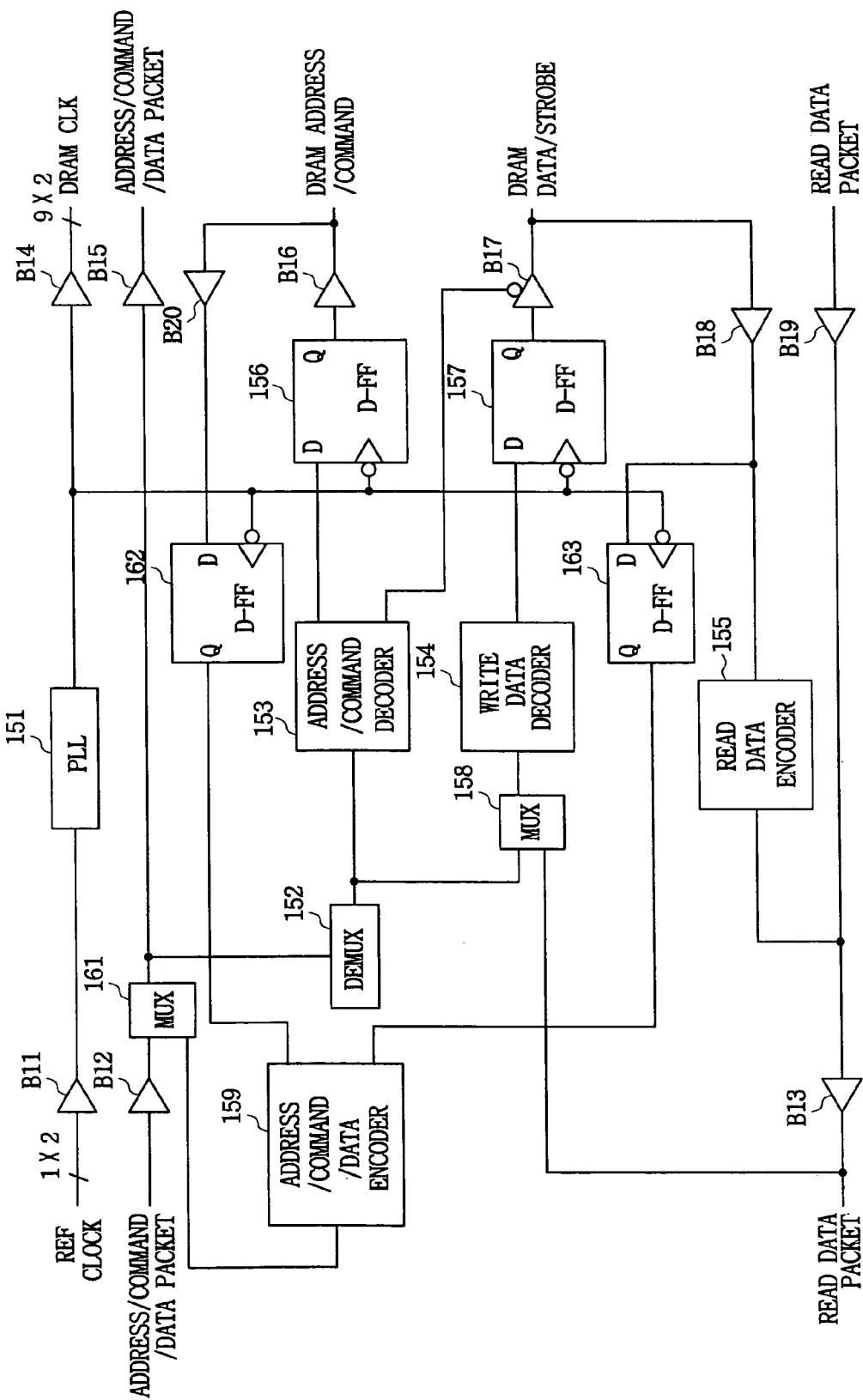
FIG. 7 is an exemplary block diagram illustrating a test hub.

FIG. 7 is an exemplary block diagram illustrating a test hub according to embodiments of the present invention. The test hub of FIG. 7 includes D-flip-flops 162 and 163 in addition to the configuration of the test hub of FIG. 5. The D-flip-flops 162 and 163 may operate to synchronize a memory command applied from a DRAM ADDRESS/COMMAND terminal and a memory data applied from a DRAM DATA/STROBE terminal with a reference clock signal REF CLOCK, respectively. This synchronization may occur before the memory command and the memory data are input into the address/command/data encoder 159. The other components of the test hub of FIG. 7, except for the D-flip-flops 162 and 163, perform substantially the same function as those of the test hub 150 of FIG. 5.

FIG. 8 is an exemplary plan view illustrating a configuration mounting a memory module having a hub by using a test hub in a system using a memory module which has no hubs. A memory command and memory data, output from the system including computer 810, are converted into a packet data by the test hub 150 and are applied to the hub 110 of the memory module 100. Packet data output from the hub 110 of the memory module 100 is converted into a memory command and memory data by the test hub 150. Using the memory module test system having a configuration of FIG. 8, a memory module having a hub can be evaluated in a system which uses memory modules having no hubs, by using the test hub.

As described, the memory module test system of embodiments of the present invention can test a memory module having a hub, because a memory command and memory data output from the tester can be converted into packet data. Further, the memory module evaluation system of embodiments of the present invention can evaluate a memory module having a hub in a memory module mounting system using a memory module having no hub.

It would be obvious to one of ordinary skill in the art, to modify the disclosed embodiments of the present invention, without departing from the spirit of the present invention. The disclosed embodiments are intended to be exemplary. The present invention should be construed with respect to the appended claims.

What is claimed is:

1. A memory module test system, comprising:
   at least one memory module, including a first hub and a plurality of semiconductor memory devices;
   a tester which tests the at least one memory module; and
   a second hub, which is located between the first hub and the tester, wherein the second hub:
     converts a first memory command and first memory data output from the tester into first packet data;
     transfers the first packet data to the first hub;
     converts second packet data output from the first hub to the second hub into second memory data; and
     transfers the second memory data to the tester;
   wherein the first hub includes:
   a data divider which receives the first packet data and divides the first packet data into a first output and a second output;
   a first decoder, which:
     receives the first output of the data divider;
     converts the first output into a second memory command; and
     transmits the second memory command to at least one of the plurality of semiconductor memory devices;
   a second decoder, which:
     receives the second output of the data divider;
     converts the second output into second memory data; and
     transmits the second memory data to the plurality of semiconductor memory device;
   an encoder, which receives third memory data from the plurality of semiconductor memory device and converts the third memory data into the second packet data;
   a first connection line which transmits first packet data to an adjacent memory module; and
   a second connection line which receives and outputs the first packet data from the adjacent memory module.

2. The system of claim 1, wherein the second hub is mounted on the tester.

3. The system of claim 1, wherein the data divider is a demultiplexer.

4. The system of claim 1, wherein the second hub includes:
   an encoder which:
     receives the first memory command and the first memory data from the tester;
     converts the first memory command and the first memory data into first packet data; and
     transfer the first packet data to the first hub;
   a decoder which:
     receives third packet data from an adjacent memory module; and
     converts the third packet data into parallel data having predetermined bits.

5. The system of claim 4, wherein the second hub further includes:
   a phase locked loop which receives and phase-synchronizes a reference clock signal; and
   a flip-flop which synchronizes an output of the decoder by using an output of the phase locked loop as a control clock.

6. The system of claim 1, wherein the second hub includes:
   a first selecter which receives fourth packet data and fifth packet data and selects one of the fourth packet data and the fifth packet data;
   a data divider which receives an output of the first selecter and divide the output of the first selecter into a first output and a second output;
   a first decoder which:
     receives the first output of the data divider;
     converts the first output into a memory command; and
     transmits the memory command to a memory command terminal;
   a first encoder which:
     receives the first memory command from the memory command terminal and the first memory data from a memory data terminal;
     encodes the first packet data from the first memory command and the first memory data; and
     outputs the first packet data;
   a second encoder which:
     receives the first memory data from the memory data terminal; and
     converts the memory data into packet data;
   a second decoder which:
     receives the second output of the data divider;
     converts the second output into the second memory data; and
     transfers the second memory data to the memory data terminal;
   a first connection line configured to transfer the first packet data to an adjacent memory module;
   a second connection line configured to receive and output a sixth packet data from the adjacent memory module; and
   a second selecter which:
     receives the sixth packet data and an output signal of the data divider; and selects one of the sixth packet data and the output signal of the data divider.

7. The system of claim 6, wherein the second hub includes:
a phase locked loop which receives a reference clock signal and synchronizes a phase of the reference clock signal;
a first flip-flop which synchronizes an output of the first decoder by using an output of the phase locked loop as a control clock; and
a second flip-flop which synchronizes an output of the second decoder by using an output of the phase locked loop as a control clock.

8. The system of claim 7, wherein the second hub includes third flip-flops between the memory command terminal and the first encoder and between the memory data terminal and the first encoder, respectively.

9. The system of claim 6, wherein the second hub can function as the first hub and can be used as the first hub.

10. The system of claim 6, wherein the first and second selecters are multiplexers.

11. The system of claim 6, wherein the divider is a demultiplexer.

* * * * *